(12) United States Patent
de Boeij et al.

(10) Patent No.: US 11,947,271 B2
(45) Date of Patent: *Apr. 2, 2024

(54) LITHOGRAPHIC SYSTEMS AND METHODS OF OPERATING THE SAME

(71) Applicant: Kulicke & Soffa Liteq B.V., Eindhoven (NL)

(72) Inventors: Jeroen de Boeij, 's-Hertogenbosch (NL); Mikhail Yurievich Loktev, Valkenswaard (NL)

(73) Assignee: Kulicke & Soffa Liteq B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/074,600

(22) Filed: Dec. 5, 2022

(65) Prior Publication Data

US 2023/0095872 A1 Mar. 30, 2023

Related U.S. Application Data

(63) Continuation of application No. 17/600,956, filed as application No. PCT/EP2020/055074 on Feb. 26, 2020, now Pat. No. 11,550,232.

(60) Provisional application No. 62/831,381, filed on Apr. 9, 2019.

(51) Int. Cl.
G03F 7/00 (2006.01)

(52) U.S. Cl.
CPC ...... *G03F 7/70875* (2013.01); *G03F 7/70066* (2013.01)

(58) Field of Classification Search
CPC .................. G03F 7/70875; G03F 7/70066
See application file for complete search history.

(56) References Cited

U.S. PATENT DOCUMENTS

| | | | | |
|---|---|---|---|---|
| 6,078,381 A * | 6/2000 | Suzuki | ............. | G03F 7/70225 355/53 |
| 7,382,439 B2 * | 6/2008 | Butler | ............. | G03F 7/70066 355/71 |
| 8,059,261 B2 * | 11/2011 | Verweij | ............. | G03F 7/70858 355/71 |
| 11,550,232 B2 * | 1/2023 | de Boeij | ............. | G03F 7/70066 |

FOREIGN PATENT DOCUMENTS

EP 1491960 A2 12/2004

OTHER PUBLICATIONS

International Search Report completed on Jun. 23, 2020, International Application No. PCT/EP2020/055074.

\* cited by examiner

*Primary Examiner* — Hung V Nguyen
(74) *Attorney, Agent, or Firm* — Christopher M. Spletzer, Sr.

(57) ABSTRACT

A lithographic system for projecting an image onto a workpiece using radiation is provided. The lithographic system includes: a support structure for supporting a workpiece; a radiation source for providing radiation to project an image on the workpiece; a reticle positioned between the radiation source and the workpiece; and a mask positioned adjacent the reticle, the mask being configured to block radiation from the radiation source, the mask including a heat removal apparatus.

19 Claims, 11 Drawing Sheets

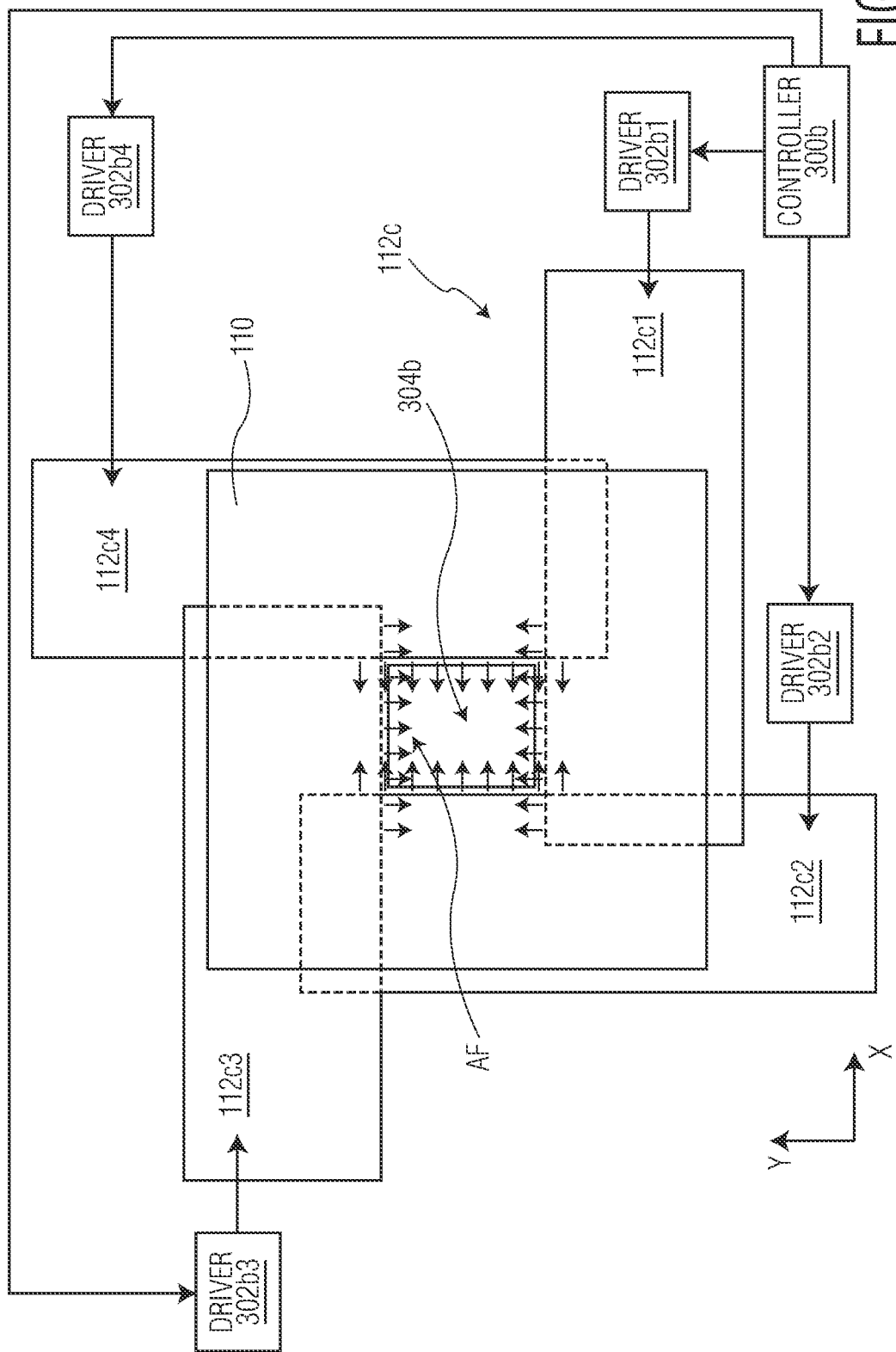

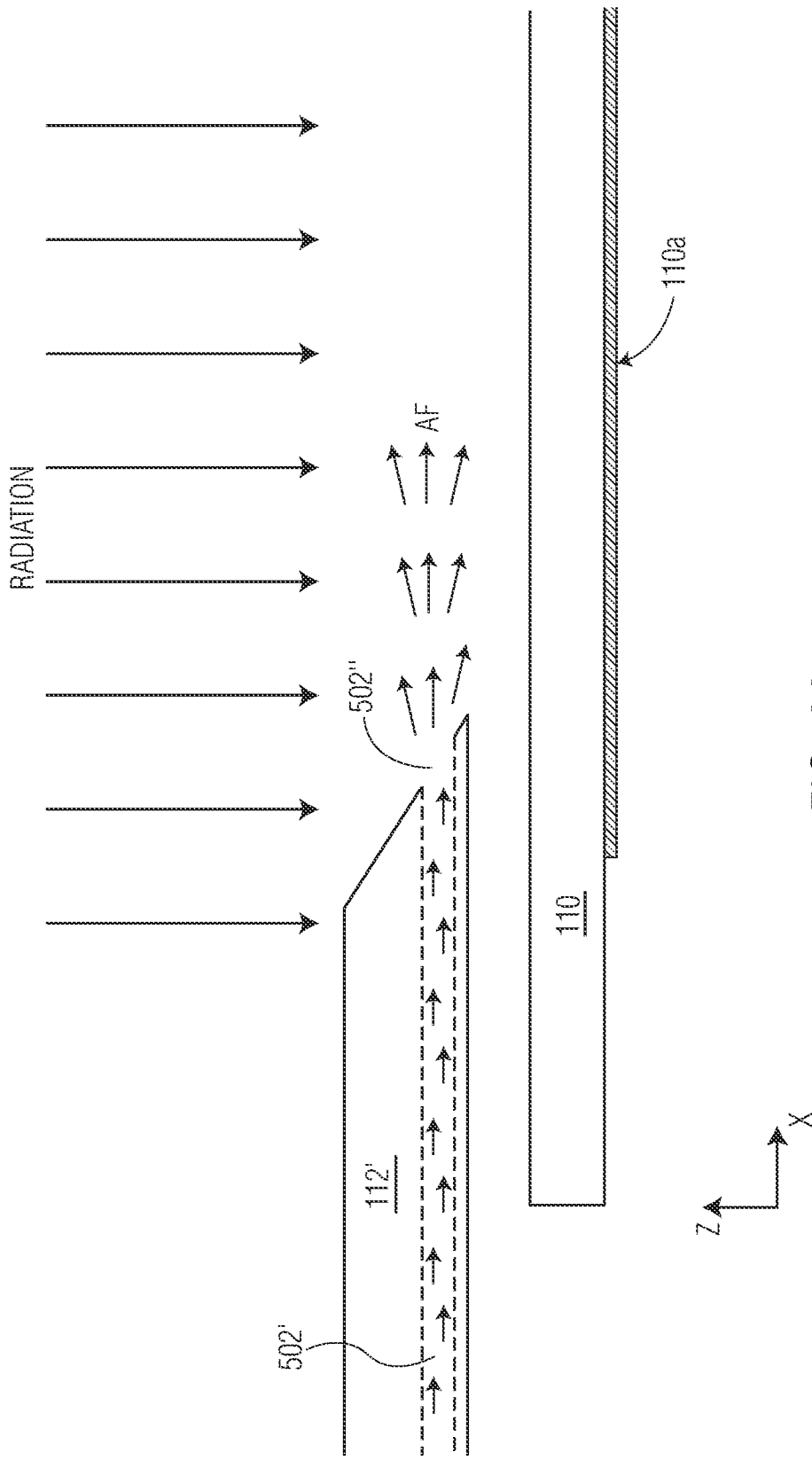

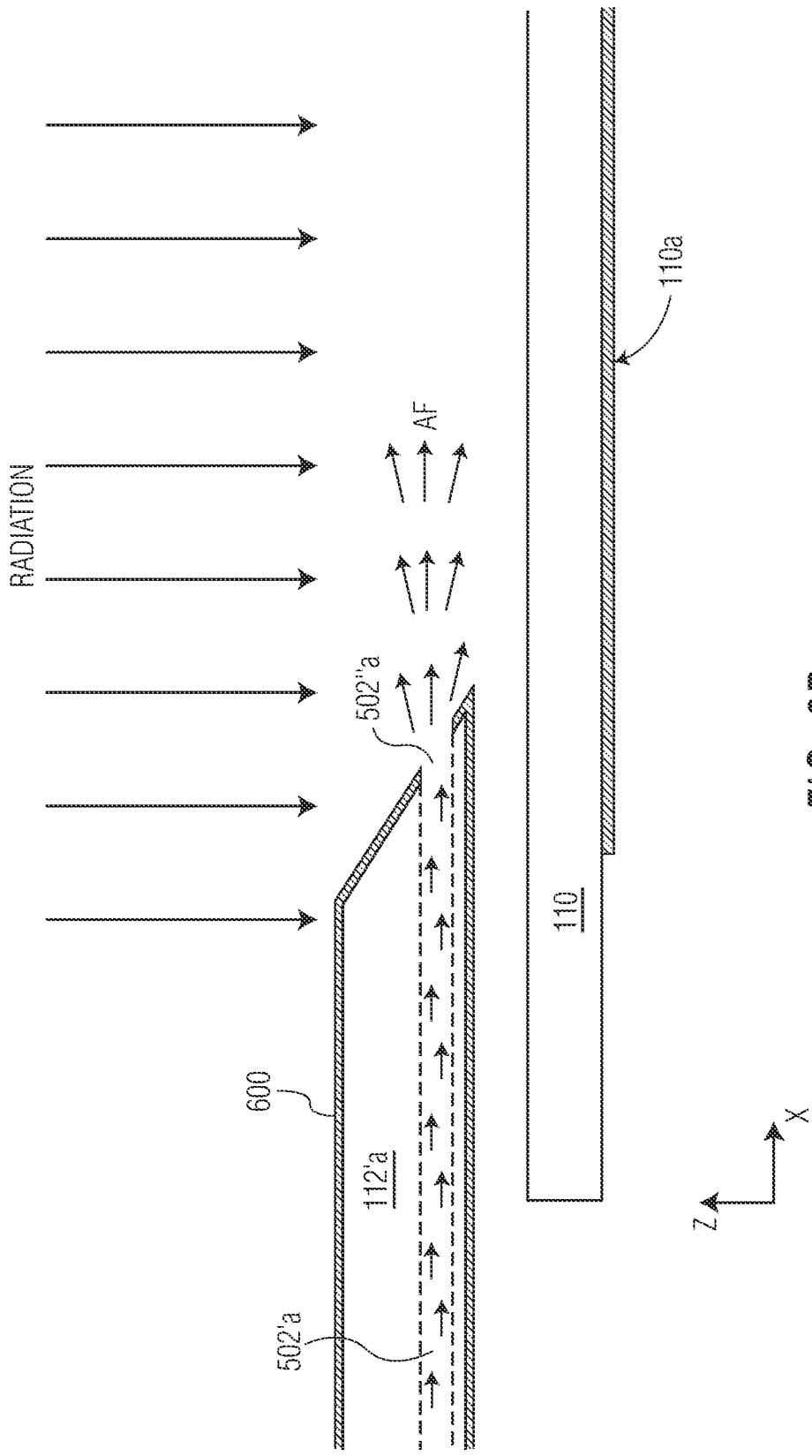

LITHOGRAPHIC SYSTEMS AND METHODS OF OPERATING THE SAME

CROSS-REFERENCE TO RELATED APPLICATION

This application is a continuation of U.S. patent application Ser. No. 17/600,956 filed Oct. 1, 2021, which claims the benefit of International Application No. PCT/EP2020/055074 filed Feb. 26, 2020, which claims priority to U.S. Provisional Application No. 62/831,381, filed Apr. 9, 2019, the content of all of which are incorporated herein by reference.

FIELD

The invention relates to lithographic systems, and more particularly, to systems and methods addressing heat in the area of the reticle of the lithographic system.

BACKGROUND

In lithography applications, radiation provided by a radiation source is used to expose fields on a workpiece (e.g., a wafer). Often, it is desired to expose not only full fields on the workpiece, but also partial fields (e.g., for alignment marks on the workpiece).

Conventional systems (including some form of reticle masking) are shown in, for example: U.S. Pat. Nos. 6,348,303; and 7,382,439. Such systems include reticle masking using blades in the illuminator of the system, and not adjacent the reticle.

Certain conventional lithographic systems include reticles having a light blocking layer (e.g., a chromium layer), where the layer absorbs a part of the radiation from a radiation source of the lithographic system. This radiation absorption causes the reticle to heat up, thereby deforming the reticle by thermal expansion, consequently resulting in a deformation of the pattern that is projected onto a workpiece.

Thus, it would be desirable to provide improved lithographic systems (and related methods) overcoming one or more of the deficiencies of conventional systems.

SUMMARY

According to an exemplary embodiment of the invention, a lithographic system for projecting an image onto a workpiece using radiation is provided. The lithographic system includes: a support structure for supporting a workpiece; a radiation source for providing radiation to project an image on the workpiece; a reticle positioned between the radiation source and the workpiece; and a mask positioned adjacent the reticle, the mask being configured to block radiation from the radiation source, the mask including a heat removal apparatus.

According to another exemplary embodiment of the invention, another lithographic system for projecting an image onto a workpiece using radiation is provided. The lithographic system includes: a support structure for supporting a workpiece; a radiation source for providing radiation to project an image on the workpiece; a reticle positioned between the radiation source and the workpiece; and a mask positioned adjacent the reticle, the mask being configured to block radiation from the radiation source, wherein the mask includes a body portion and a radiation absorbing coating applied to at least a portion of an external surface of the body portion.

According to yet another exemplary embodiment of the invention, another lithographic system for projecting an image onto a workpiece using radiation is provided. The lithographic system includes: a support structure for supporting a workpiece; a radiation source for providing radiation to project an image on the workpiece; a reticle positioned between the radiation source and the workpiece; and a mask positioned adjacent the reticle. The mask is configured to block radiation from the radiation source. The mask defines an illumination area of an image to be projected onto the workpiece using a pattern of the reticle and radiation from the radiation source. The illumination area defined by the mask is variable.

According to yet another exemplary embodiment of the invention, another lithographic system for projecting an image onto a workpiece using radiation is provided. The lithographic system includes: a support structure for supporting a workpiece; a radiation source for providing radiation to project an image on the workpiece; a reticle positioned between the radiation source and the workpiece; and a mask positioned adjacent the reticle. The mask is configured to block radiation from the radiation source. The mask defines an illumination area of an image to be projected onto the workpiece using a pattern of the reticle and radiation from the radiation source. The mask includes a plurality of elements configured to define the illumination area, wherein at least one of the plurality of elements is positioned above the reticle along a z-axis of the lithographic system, and at least one other of the plurality of elements is positioned below the reticle along the z-axis of the lithographic system.

According to yet another exemplary embodiment of the invention, a method of operating a lithographic system is provided. The method includes the steps of: (a) supporting a workpiece using a support structure of the lithographic system; (b) projecting an image on the workpiece using radiation from a radiation source of the lithographic system; (c) positioning a reticle between the radiation source and the workpiece; (d) positioning a mask adjacent the reticle, the mask being configured to block radiation from the radiation source; and (e) removing heat from at least one of the mask and the reticle with a heat removal apparatus of the mask.

According to yet another exemplary embodiment of the invention, another method of operating a lithographic system is provided. The method includes the steps of: (a) supporting a workpiece using a support structure of the lithographic system; (b) projecting an image on the workpiece using radiation from a radiation source of the lithographic system; (c) positioning a reticle between the radiation source and the workpiece; and (d) positioning a mask adjacent the reticle, the mask being configured to block radiation from the radiation source, wherein the mask including a body portion and a radiation absorbing coating applied to at least a portion of an external surface of the body portion.

According to yet another exemplary embodiment of the invention, another method of operating a lithographic system is provided. The method includes the steps of: (a) supporting a workpiece using a support structure of the lithographic system; (b) projecting an image on the workpiece using radiation from a radiation source of the lithographic system; (c) positioning a reticle between the radiation source and the workpiece; and (d) positioning a mask adjacent the reticle, the mask being configured to block radiation from the radiation source, the mask defining an illumination area of the projected image using a pattern of the reticle and radiation from the radiation source, the illumination area defined by the mask being variable.

According to yet another exemplary embodiment of the invention, another method of operating a lithographic system is provided. The method includes the steps of: (a) supporting a workpiece using a support structure of the lithographic system; (b) projecting an image on the workpiece using radiation from a radiation source of the lithographic system; (c) positioning a reticle between the radiation source and the workpiece; and (d) positioning a mask adjacent the reticle, the mask being configured to block radiation from the radiation source, the mask defining an illumination area of the projected image using a pattern of the reticle and radiation from the radiation source, the mask including a plurality of elements configured to define the illumination area, wherein at least one of the plurality of elements is positioned above the reticle along a z-axis of the lithographic system, and at least one other of the plurality of elements is positioned below the reticle along the z-axis of the lithographic system.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

FIG. 3B is a top view of a portion of a lithographic system in accordance with yet another exemplary embodiment of the invention;

FIG. 6A is a side view of a portion of a lithographic system in accordance with an exemplary embodiment of the invention;

FIG. 6B is a side view of a portion of a lithographic system in accordance with another exemplary embodiment of the invention.

DETAILED DESCRIPTION

As provided above, in many lithography applications it is desirable to expose not only full fields but also partial fields (e.g., for alignment marks, or edge exposure protection of the workpiece, etc.). In accordance with certain exemplary embodiments of the invention, this may be accomplished using a reticle masking module. Such a module may include four (4) elements/blades (or some other number of elements/blades) used to define the illumination area of the mask. In high resolution lithography with a high NA (numerical aperture) lens, a reticle masking module may be positioned in the illuminator. In a lithography system with lower NA it is possible to place the reticle masking blades close to (adjacent) the reticle. To prevent stray light (and related deleterious effects), the elements/blades of the mask (and/or a blocking part of the reticle) may absorb part of this light energy using a light absorbing coating (e.g., an inorganic black coating which absorbs radiation instead of reflecting it, to avoid stray light resulting in ghost images and the like), leading to high temperatures around the reticle. In such cases, it is desirable to have at least one of the mask (including the aforementioned elements/blades) and the reticle for cooling using a heat reducing element of the mask. This may be accomplished, for example, by providing internal forced convection cooling channels in parts of the mask. By adding additional holes in the blade facing the exposed part of the reticle, the same forced convection air may be used to cool the reticle.

Figure 1:
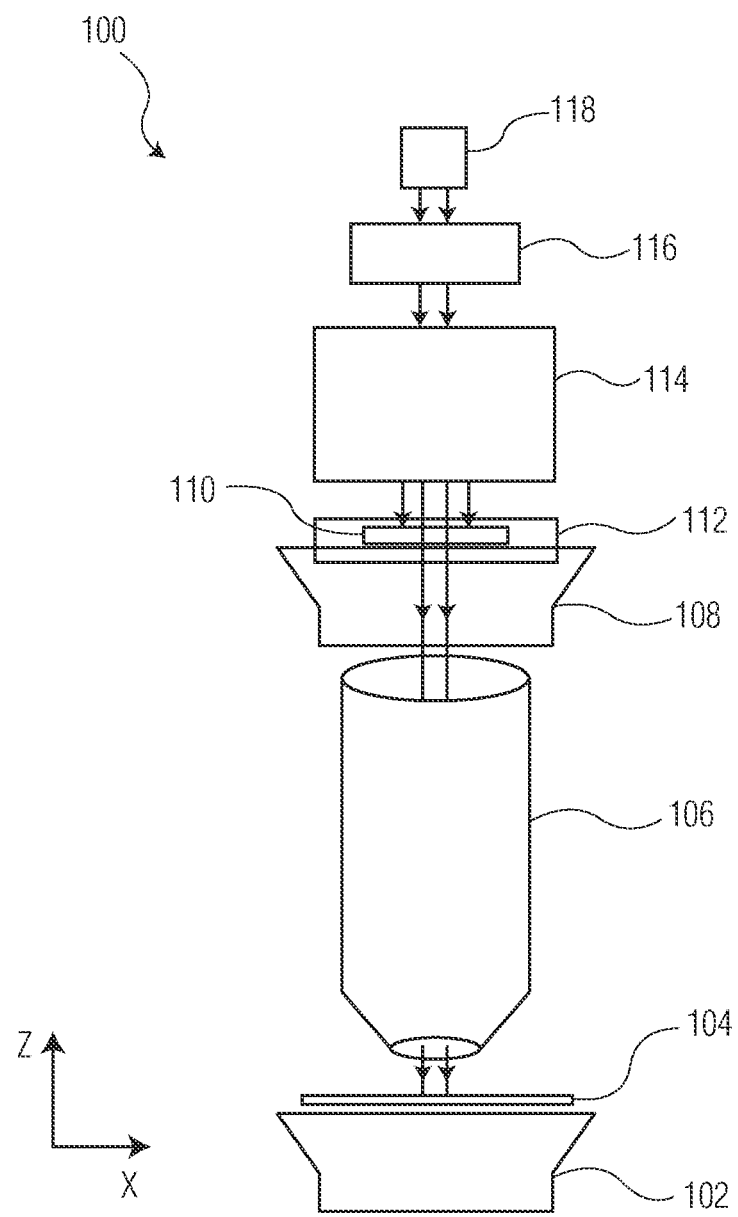
FIG. 1 illustrates a side view of a lithographic system in accordance with an exemplary embodiment of the invention.

FIG. 1 illustrates a lithographic system 100 for projecting an image onto a workpiece 104 using radiation. Lithographic system 100 includes a support structure 102 (e.g., a wafer table) for supporting the workpiece 104 (e.g., a wafer, a panel, a rectangular panel or other workpiece, etc.). Lithographic system 100 also includes a radiation source 118 (e.g., a mercury lamp, a laser, etc.) for providing radiation to project an image on the workpiece 104. As shown in FIG. 1, the radiation (represented by lines including downward pointed arrow heads) passes through other elements of lithographic system 100. More specifically, radiation from radiation source 118 passes through a beam delivery system 116 and an illuminator 114, both included in lithographic system 100. Beam delivery system 116 steers the radiation from radiation source 118 to an entrance of illuminator 114, and generally includes suitable directing mirrors. Illuminator 114 provides a conditioned beam of radiation to a reticle 110 having a desired uniformity and intensity distribution in its cross-section. Downstream of illuminator 114, lithographic system 100 also includes a projection system 106 for projecting the radiation prior to receipt by workpiece 104.

Reticle 110 is positioned between radiation source 118 and workpiece 104. Reticle 110 is supported by a reticle table 108. A reticle pattern 110 is provided on reticle 110 (e.g., see reticle pattern 110a in FIGS. 6A-6C). Lithographic system 100 also includes a mask 112 positioned adjacent reticle 110. Mask 112 is configured to block certain radiation from radiation source 118 (while other parts of radiation pass through mask 112 and continue downstream toward workpiece 104. For example, mask 112 may define an illumination area of an image to be projected onto workpiece 104 using a pattern of reticle 110 and radiation from radiation source 118.

In accordance with the invention, there are various different implementations of mask 112, and its relationship (e.g., spatial relationship) with reticle 110. FIG. 1 is intended to broadly represent these different implementations. FIG. 2, FIGS. 3A-3C, FIG. 4, FIGS. 5A-5E, and FIGS. 6A-6C provide specific examples of a mask; each of these examples may be included in the configuration of FIG. 1. Thus, mask 112 in FIG. 1 is illustrated around reticle 110 (e.g., mask 112 may be above reticle 110, mask 112 may be below reticle 110, mask 112 may be partially above and partially below reticle 110, etc.).

Figure 2:
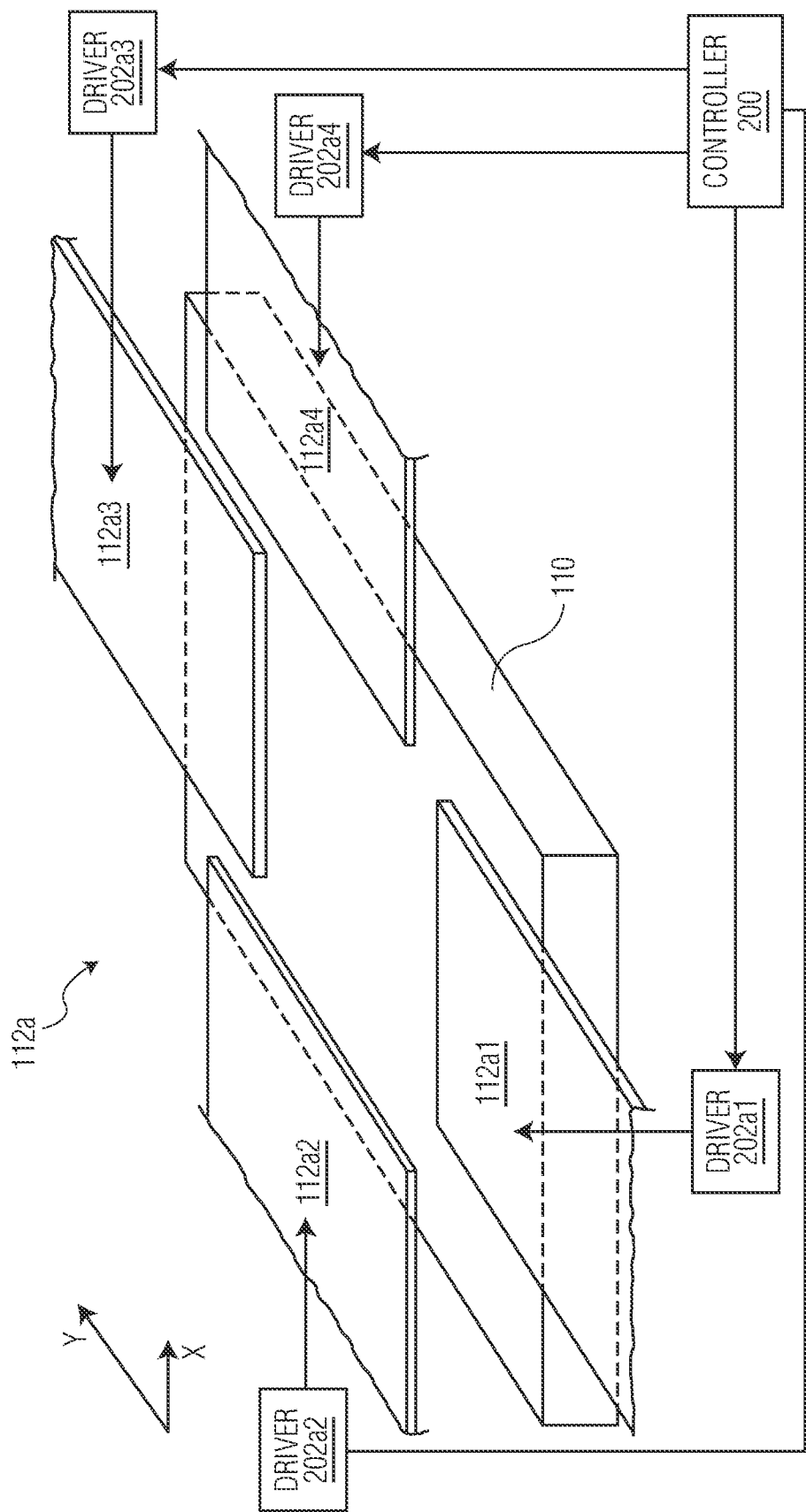
FIG. 2 is a perspective view of a portion of a lithographic system in accordance with an exemplary embodiment of the invention.

For example, in accordance with various exemplary embodiments of the invention, mask 112 may include a plurality of elements (e.g., blades or other elements) collectively defining an illumination area of an image to be projected onto the workpiece using a pattern of the reticle and radiation from the radiation source. In a specific example, FIG. 2 illustrates a mask 112$a$ including a plurality of elements 112$a$1, 112$a$2, 112$a$3, and 112$a$4. Each of elements 112$a$1, 112$a$2, 112$a$3, and 112$a$4 is independently moveable along at least one of the x-axis and the y-axis of lithographic system 100 using respective drivers 202$a$1, 202$a$2, 202$a$3, and 202$a$4. In FIG. 2, the lithographic system 100 also includes controller 200 for controlling each of drivers 202$a$1, 202$a$2, 202$a$3, and 202$a$4. Through the movement of elements 112$a$1, 112$a$2, 112$a$3, and 112$a$4 (via controller 200, and drivers 202$a$1, 202$a$2, 202$a$3, and 202$a$4) a desired illumination area is defined by the elements 112$a$1, 112$a$2, 112$a$3, and 112$a$4. Thus, the illumination area may be adjusted as desired to project an image onto the workpiece using a pattern of the reticle and radiation from the radiation source.

Figure 3A:
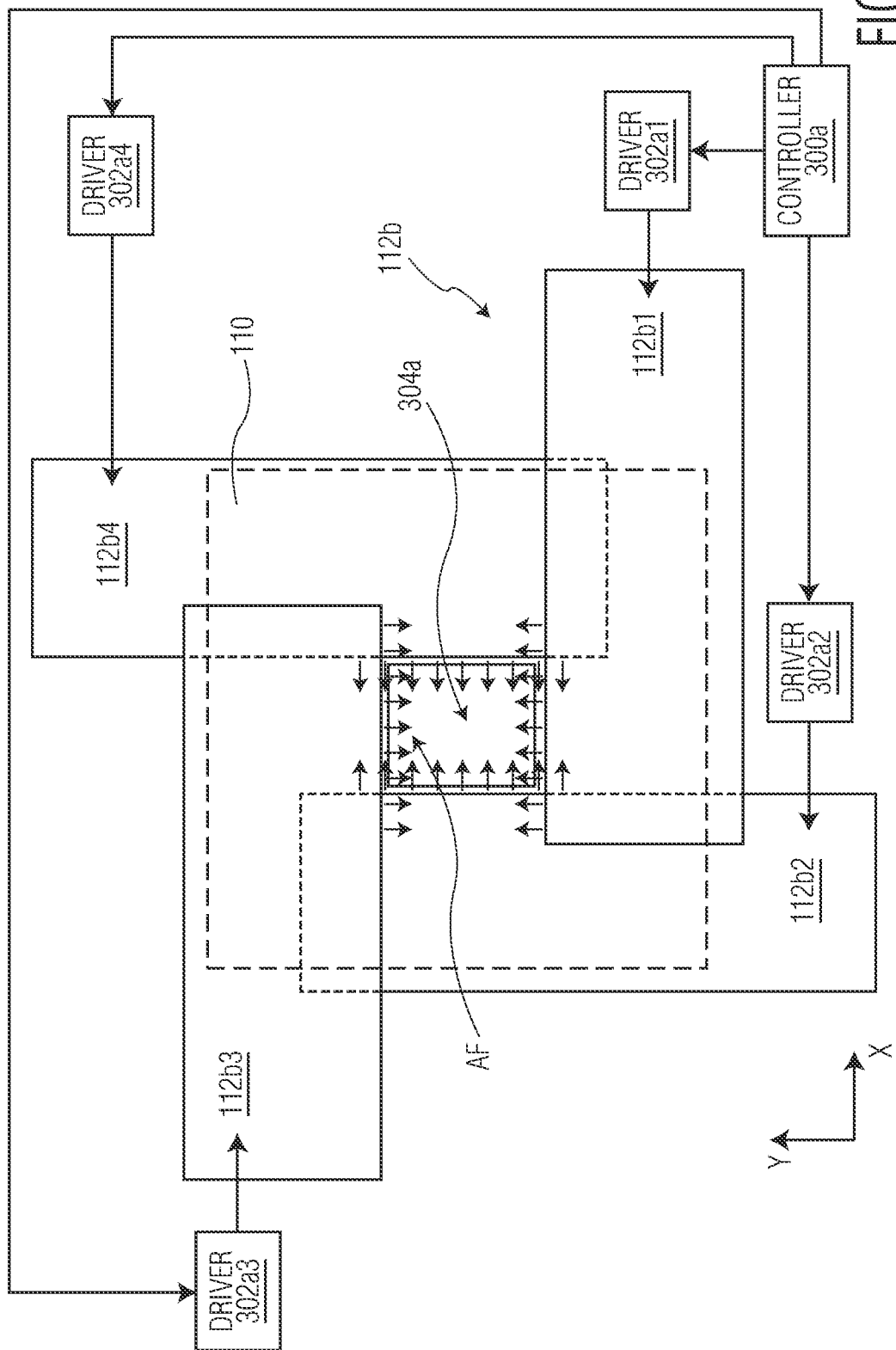
FIG. 3A is a top view of a portion of a lithographic system in accordance with another exemplary embodiment of the invention.
Figure 3C:
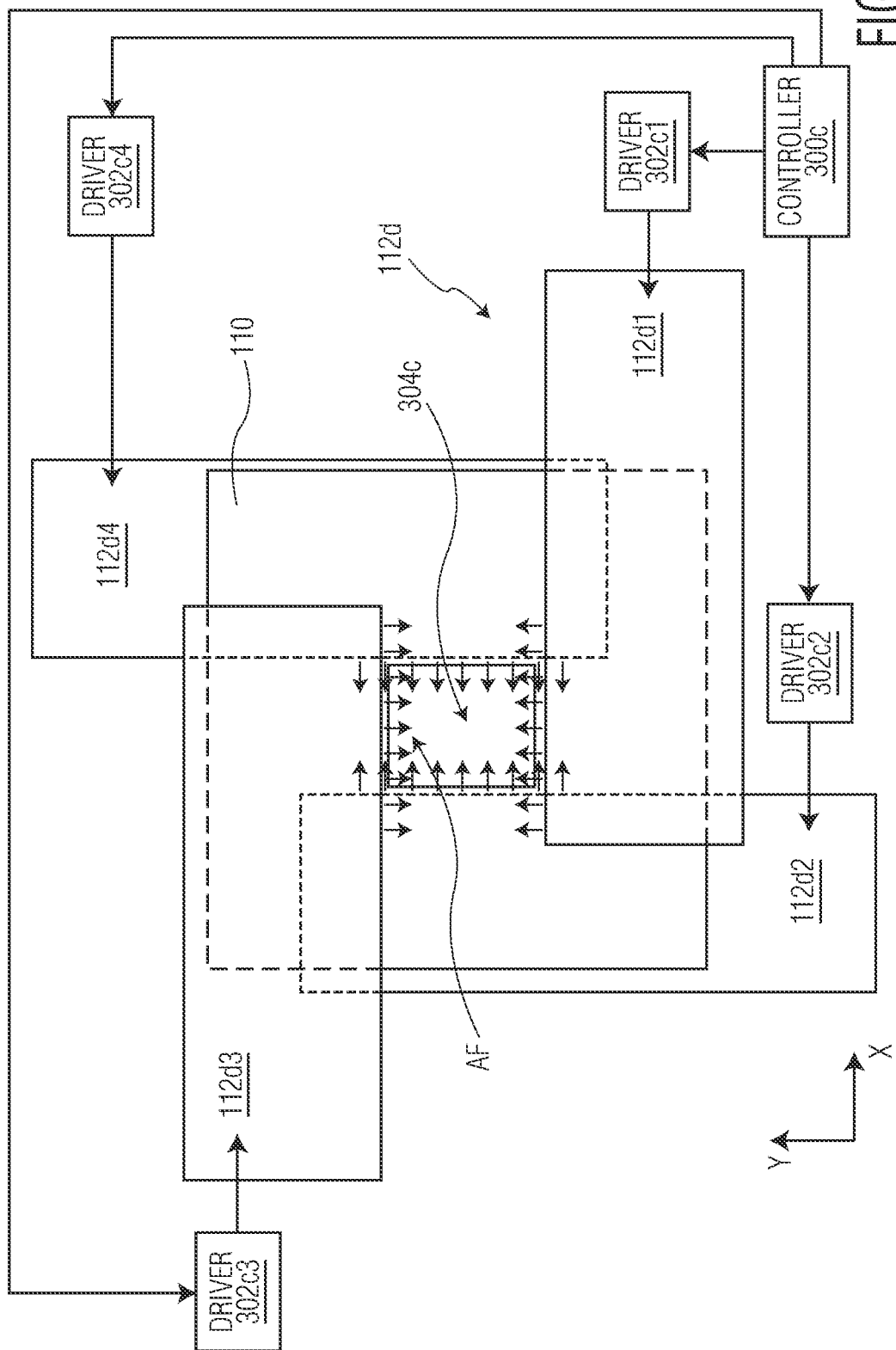
FIG. 3C is a top view of a portion of a lithographic system in accordance with yet another exemplary embodiment of the invention.

FIGS. 3A-3C are variations of the embodiment described above with respect to FIG. 2. In FIG. 3A, a mask 112$b$ includes a plurality of elements 112$b$1, 112$b$2, 112$b$3, and 112$b$4. Each of elements 112$b$1, 112$b$2, 112$b$3, and 112$b$4 is independently moveable along at least one of the x-axis and the y-axis of lithographic system 100 using respective drivers 302$a$1, 302$a$2, 302$a$3, and 302$a$4 (and controller 300$a$ for controlling each of drivers 302$a$1, 302$a$2, 302$a$3, and 302$a$4). Thus, illumination area 304$a$ defined by mask 112$b$ may be adjusted. In FIG. 3A, each of elements 112$b$1, 112$b$2, 112$b$3, and 112$b$4 is positioned above reticle 110 along a z-axis of the lithographic system.

In FIG. 3B, a mask 112$c$ includes a plurality of elements 112$c$1, 112$c$2, 112$c$3, and 112$c$4. Each of elements 112$c$1, 112$c$2, 112$c$3, and 112$c$4 is independently moveable along at least one of the x-axis and the y-axis of lithographic system 100 using respective drivers 302$b$1, 302$b$2, 302$b$3, and 302$b$4 (and controller 300$b$ for controlling each of drivers 302$b$1, 302$b$2, 302$b$3, and 302$b$4). Thus, illumination area 304$b$ defined by mask 112$c$ may be adjusted. In FIG. 3B, each of elements 112$c$1, 112$c$2, 112$c$3, and 112$c$4 is positioned below reticle 110 along a z-axis of the lithographic system.

In FIG. 3C, a mask 112$d$ includes a plurality of elements 112$d$1, 112$d$2, 112$d$3, and 112$d$4. Each of elements 112$d$1, 112$d$2, 112$d$3, and 112$d$4 is independently moveable along at least one of the x-axis and the y-axis of lithographic system 100 using respective drivers 302$c$1, 302$c$2, 302$c$3, and 302$c$4 (and controller 300$c$ for controlling each of drivers 302$c$1, 302$c$2, 302$c$3, and 302$c$4). Thus, illumination area 304$c$ defined by mask 112$d$ may be adjusted. In FIG. 3C, each of elements 112$d$1 and 112$d$3 are positioned above reticle 110, and each of elements 112$d$2 and 112$d$4 are positioned below reticle 110, along a z-axis of the lithographic system. By providing a portion of elements 112$d$1, 112$d$2, 112$d$3, and 112$d$4 above reticle 110, and another portion of elements 112$d$1, 112$d$2, 112$d$3, and 112$d$4 below reticle 110, benefits are provided in that a distance between elements 112$d$1, 112$d$2, 112$d$3, and 112$d$4 and the reticle pattern (e.g., see reticle patterns 110$a$ in FIGS. 6A-6C) is minimized, thus limiting the size of the half shadow. The half shadow is the transition from fully illuminated to fully blocked radiation. The smaller the half shadow, the smaller the separation on the reticle between the different illumination patterns on the reticle.

Figure 4:
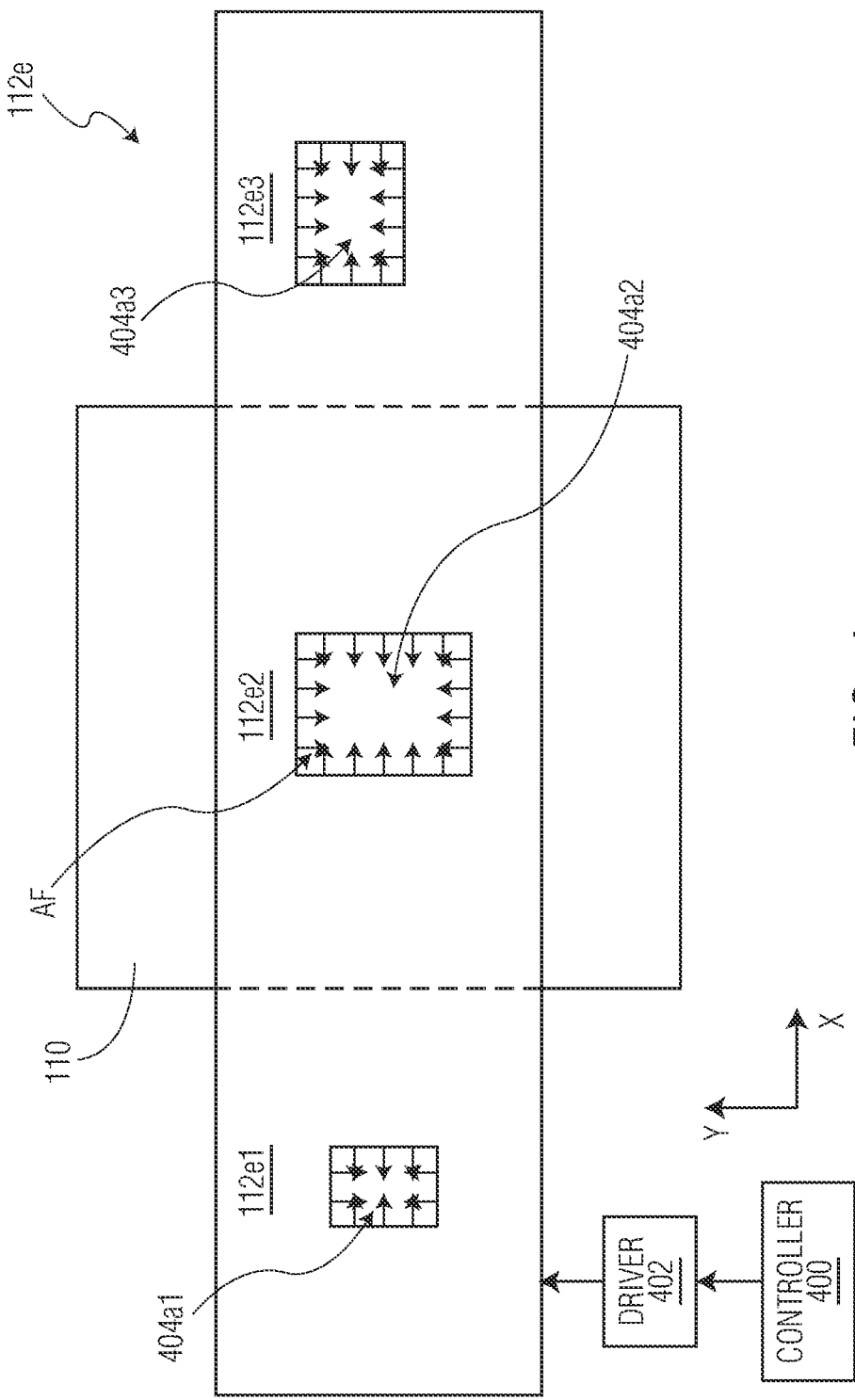
FIG. 4 is a top view of a portion of a lithographic system in accordance with yet another exemplary embodiment of the invention.

FIG. 4 illustrates a mask 112$e$ in relation to reticle 110. Mask 112$e$ includes a plurality of body portions 112$e$1, 112$e$2, and 112$e$3 (where the plurality of body portions may be formed from a unitary piece of material or multiple structures). At each respective body portion, mask 112$e$ defines a corresponding one of illumination areas 404$a$1, 404$a$2, and 404$a$3, each of illumination areas 404$a$1, 404$a$2, and 404$a$3 being configured to define an image to be projected onto the workpiece using a pattern of reticle 110 and radiation from the radiation source. Mask 112$e$ is moveable within an x-y plane of lithographic system 100 using controller 400 and driver 402, to select from among the plurality of illumination areas 404$a$1, 404$a$2, and 404$a$3 for present use.

While not required within the scope of the invention, each of FIGS. 3A-3C and FIG. 4 is illustrated including a body portion (e.g., part of the mask, which may be termed a "heat removal apparatus") defining cooling channels that receive a cooling fluid from a fluid source (not shown), and that direct the cooling fluid (e.g., a cooling air, shown as "AF" for air flow) toward the reticle.

Thus, in certain exemplary embodiments of the invention, mask 112 includes a "heat removal apparatus". Such a heat removal apparatus, within the scope of the invention, may be any type of system or element for removing heat from at least one of the mask and the reticle. Examples of such a heat removal apparatus include: (a) a body portion of the mask defining at least one cooling channel configured to receive a cooling fluid from a fluid source, where the cooling fluid (e.g., air, etc.) is directed toward the reticle; (b) a body portion of the mask defining at least one cooling channel configured to receive a cooling fluid from a fluid source, where the cooling fluid (e.g., air, liquid, etc.) is provides cooling of the mask; (c) a heat sink coupled (e.g., via a conductive braid) to a body portion of the mask; and (d) a pipe coupled to a body portion of the mask, the pipe configured to direct a cooling fluid towards the reticle. Of course, other heat removal apparatuses are contemplated within the scope of the invention.

Figure 5A:
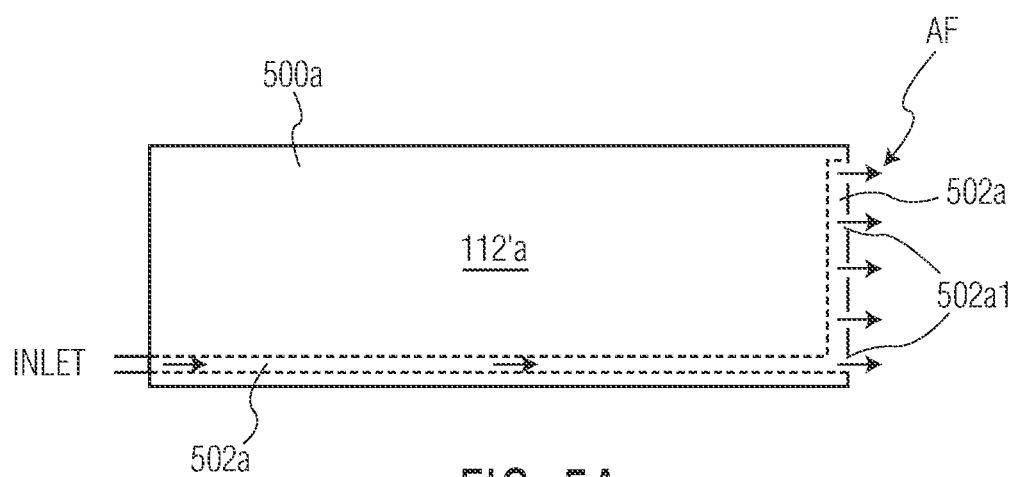
FIG. 5A is a top view of a portion of a mask of a lithographic system in accordance with an exemplary embodiment of the invention.

FIG. 5A is a top view of an element 112'$a$ (e.g., a blade) of a mask—such as any of masks 112$a$, 112$b$, 112$c$, 112$d$, and 112$e$ shown in FIGS. 2, 3A-3C, and 4. Element 112'$a$ includes a body portion 500$a$ defining a plurality of cooling channels 502$a$ configured to receive a cooling fluid from a fluid source (where the fluid enters via "inlet" from the fluid source, not shown), where the cooling fluid (e.g., air, or another cooling gas) exits body portion 500$a$ via outlets 502$a$1 and is directed toward the reticle (such as shown with arrows "AF", also in FIGS. 2, 3A-3C, and 4).

Figure 5B:
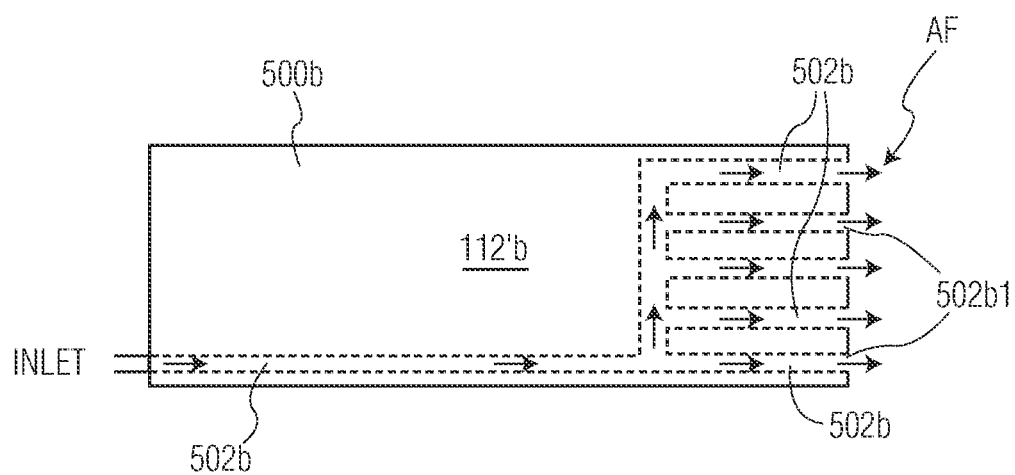
FIG. 5B is a top view of a portion of a mask of a lithographic system in accordance with another exemplary embodiment of the invention.

FIG. 5B is a top view of an element 112'$b$ (e.g., a blade) of a mask—such as any of masks 112$a$, 112$b$, 112$c$, 112$d$, and 112$e$ shown in FIGS. 2, 3A-3C, and 4. Element 112'$b$ includes a body portion 500$b$ defining a plurality of cooling channels 502$b$ configured to receive a cooling fluid from a fluid source (where the fluid enters via "inlet" from the fluid source, not shown), where the cooling fluid (e.g., air, or another cooling gas) exits body portion 500$b$ via outlets 502b1 and is directed toward the reticle (such as shown with arrows "AF", also in FIGS. 2, 3A-3C, and 4). FIG. 5B differs from FIG. 5A in that the cooling channels 502b are distributed through a more significant part of body portion 500b prior to reaching outlets 502b1. That is, in FIG. 5B, an intentional cooling function is provided to this part of body portion 500b prior to the cooling fluid exiting body portion 500b via outlets 502b1.

Figure 5C:
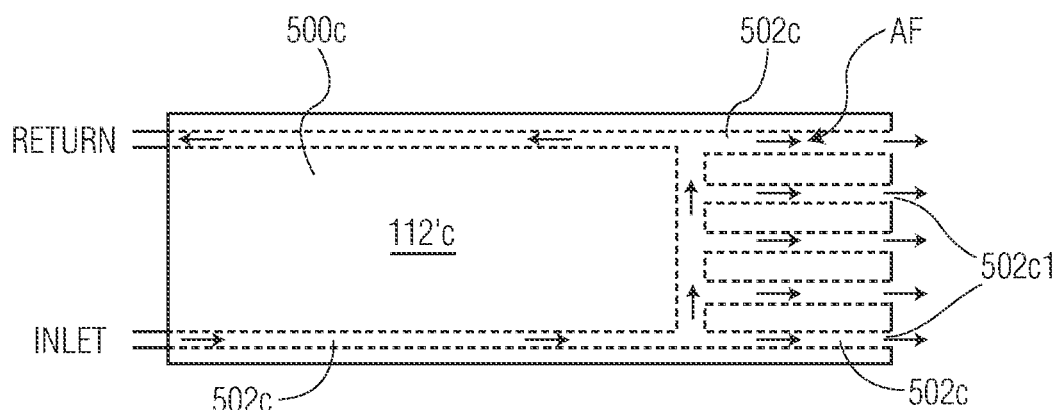
FIG. 5C is a top view of a portion of a mask of a lithographic system in accordance with yet another exemplary embodiment of the invention.

FIG. 5C is a top view of an element 112'c (e.g., a blade) of a mask—such as any of masks 112a, 112b, 112c, 112d, and 112e shown in FIGS. 2, 3A-3C, and 4. Element 112'c includes a body portion 500c defining a plurality of cooling channels 502c configured to receive a cooling fluid from a fluid source (where the fluid enters via "inlet" from the fluid source, not shown), where the cooling fluid (e.g., air, or another cooling gas) exits body portion 500c via outlets 502c1 and is directed toward the reticle (such as shown with arrows "AF", also in FIGS. 2, 3A-3C, and 4). Like FIG. 5B, in FIG. 5C the cooling channels 502c are distributed through a more significant part of body portion 500c prior to reaching outlets 502c1 to provide the cooling function to this part of body portion 500c. Further, in FIG. 5C, cooling channels 502c includes a return channel for directing cooling fluid back to the fluid source via "return" (the fluid source is not shown for simplicity).

Figure 5D:
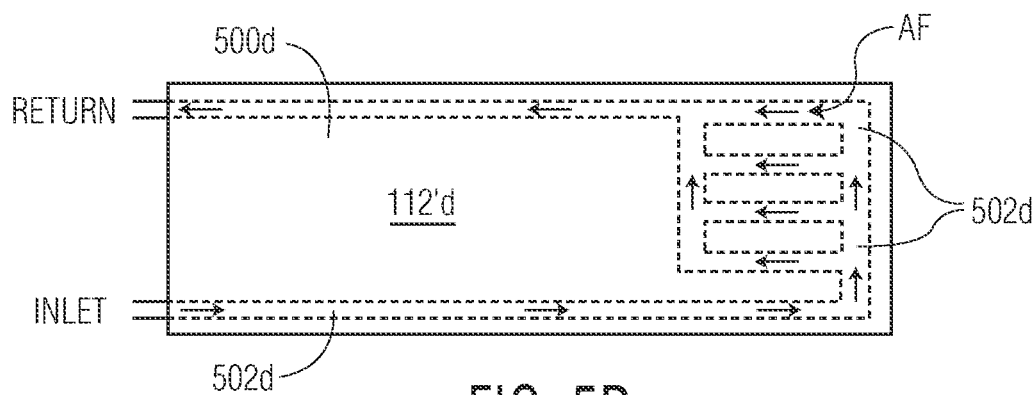
FIG. 5D is a top view of a portion of a mask of a lithographic system in accordance with yet another exemplary embodiment of the invention.

FIG. 5D is a top view of an element 112'd (e.g., a blade) of a mask—such as any of masks 112a, 112b, 112c, 112d, and 112e shown in FIGS. 2, 3A-3C, and 4. Element 112'd includes a body portion 500d defining a plurality of cooling channels 502d configured to receive a cooling fluid from a fluid source (where the fluid enters via "inlet" from the fluid source, not shown), where cooling fluid (e.g., air, liquid, or another cooling fluid) is distributed through a more significant part of body portion 500d prior to returning to the fluid source via one or more return channels for directing the cooling fluid back to the fluid source via "return" (the fluid source is not shown for simplicity).

Figure 5E:
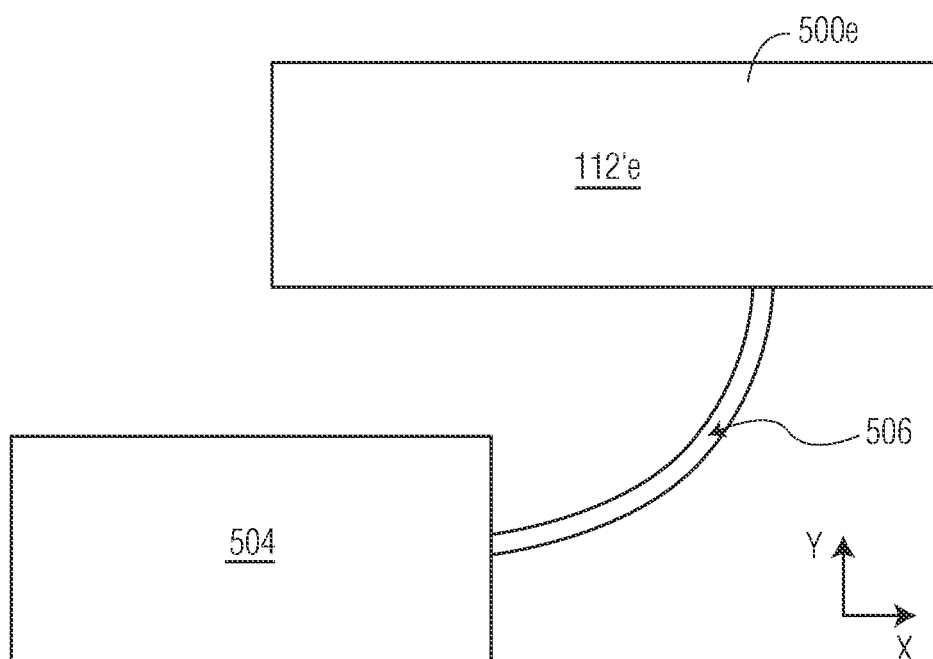
FIG. 5E is a top view of a portion of a mask of a lithographic system in accordance with yet another exemplary embodiment of the invention.

FIG. 5E is a top view of an element 112'e (e.g., a blade) of a mask—such as any of masks 112a, 112b, 112c, 112d, and 112e shown in FIGS. 2, 3A-3C, and 4. Element 112'e includes a body portion 500e, and a separate heat sink 504 coupled to body portion 500e of the mask. In the example shown in FIG. 5E, heat sink 504 is coupled to the body portion 500e via conductive braid 506. Heat sink may include active cooling (e.g., air cooling, etc.) and/or may include static cooling elements such as cooling fins or the like.

In another example a heat removal apparatus may include a pipe (or other cooling fluid carrying structure) coupled to a body portion of a mask, where the pipe is configured to direct a cooling fluid towards the reticle.

Figure 6C:
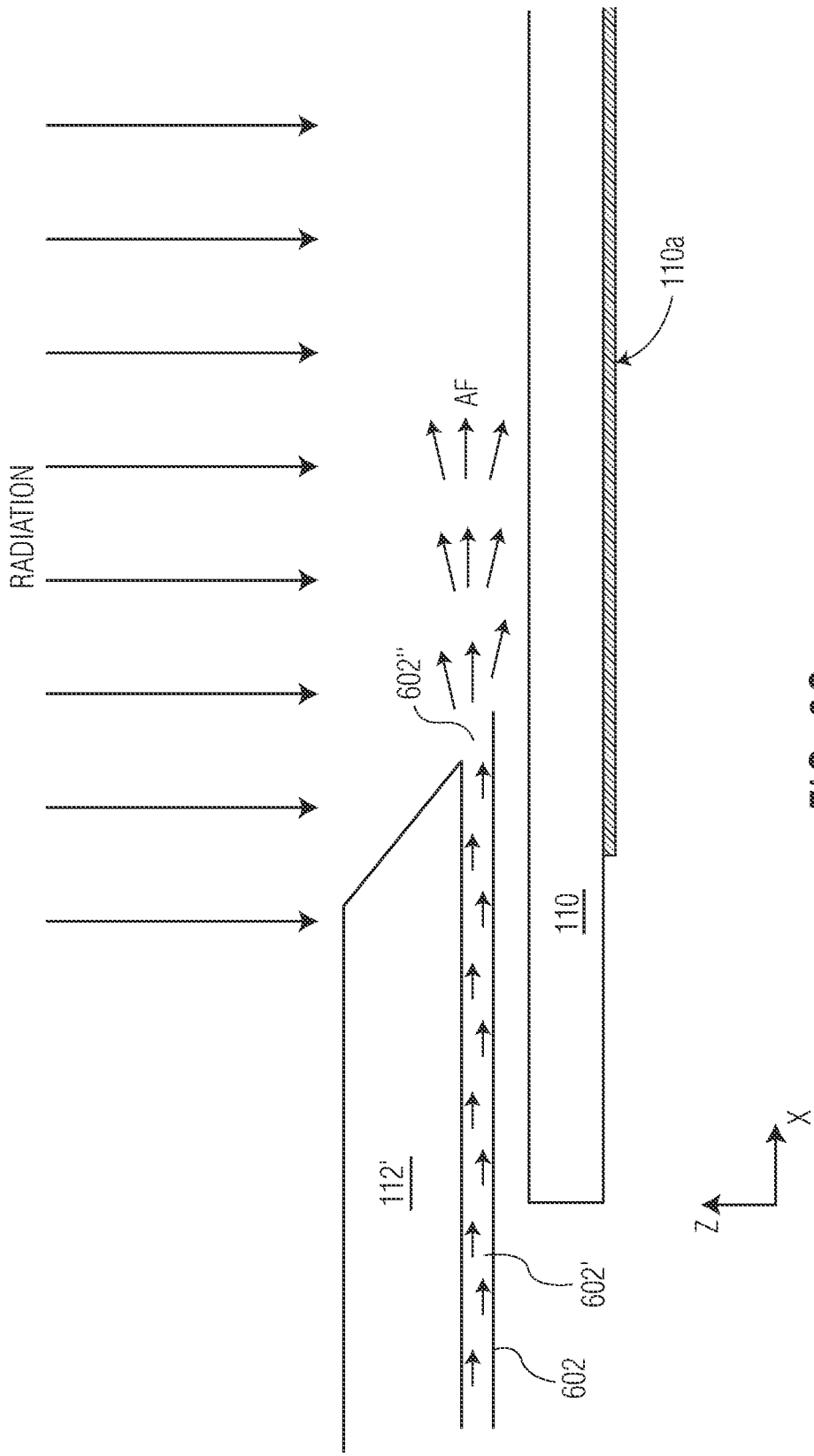
FIG. 6C is a side view of a portion of a lithographic system in accordance with yet another exemplary embodiment of the invention.

FIGS. 6A-6C are side view block diagram illustrations showing examples of cooling fluid being directed towards a reticle, where such illustrations may be applicable to any embodiment of the invention directing such cooling fluid towards a reticle (e.g., FIG. 2, FIGS. 3A-3C, FIG. 4, FIGS. 5A-5C, among others). In FIG. 6A, radiation ("RADIATION") is provided from above (e.g., from radiation source 118 shown in FIG. 1). Element 112' of a mask (e.g., a blade) includes cooling channel 502', through which a cooling fluid "AF" travels and is directed toward reticle 110 (including reticle pattern 110a) via outlet 502".

FIG. 6B is similar to FIG. 6A (with like reference numbers) except that a radiation absorbing coating 600 (e.g., an inorganic black coating) has been applied to at least a portion of an external surface of the body portion of element 112'a. This coating absorbs some of the radiation ("RADIATION") coming from radiation source 118 (e.g., see FIG. 1), undesirably resulting in heating at or around reticle 110 (including reticle pattern 110a). The cooling fluid "AF" travelling in cooling channel 502'a (and exiting outlet 502"a) provides a cooling function to at least partially address this heating.

FIG. 6C illustrates an element 112' (as in FIG. 6A), but in FIG. 6C pipe 602 (defining path 602' for cooling fluid) is coupled (either directly or indirectly) to element 112'. Cooling fluid "AF" travels in path 602', and exits element 112' at outlet 602", being directed at reticle 110 (including reticle pattern 110a).

In accordance with various exemplary embodiments of the invention, a mask of a lithographic system is positioned adjacent the reticle. With respect to the z-axis of the lithographic system, the term "adjacent" is intended to mean at least one of: (a) the mask being within 100 mm of the reticle along the z-axis; (b) the mask being within 50 mm of the reticle along the z-axis; (c) the mask being within 30 mm of the reticle along the z-axis; and (d) the mask being within 10 mm of the reticle along the z-axis.

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Rather, various modifications may be made in the details within the scope and range of equivalents of the claims and without departing from the invention.

What is claimed:

1. A lithographic system for projecting an image onto a workpiece using radiation, the lithographic system comprising:
   a support structure for supporting a workpiece;
   a radiation source for providing radiation to project an image on the workpiece;
   a reticle positioned between the radiation source and the workpiece; and
   a mask being positioned within 100 mm of the reticle along a z-axis of the lithographic system, the mask being configured to block radiation from the radiation source, wherein the mask includes a body portion and a radiation absorbing coating applied to at least a portion of an external surface of the body portion, wherein the radiation absorbing coating is an inorganic black coating.

2. The lithographic system of claim 1 wherein the mask is positioned within 30 mm of the reticle along the z-axis of the lithographic system.

3. A lithographic system for projecting an image onto a workpiece using radiation, the lithographic system comprising:
   a support structure for supporting a workpiece;
   a radiation source for providing radiation to project an image on the workpiece;
   a reticle positioned between the radiation source and the workpiece; and
   a mask being positioned within 100 mm of the reticle along a z-axis of the lithographic system, the mask being configured to block radiation from the radiation source, wherein the mask includes a body portion and a radiation absorbing coating applied to at least a portion of an external surface of the body portion, wherein the radiation absorbing coating is an inorganic black coating, the mask defining an illumination area of the image to be projected onto the workpiece using a pattern of the reticle and radiation from the radiation source, the illumination area defined by the mask being variable.

4. The lithographic system of claim 3 wherein the mask includes a plurality of elements configured to define the illumination area, at least one of the plurality of elements being moveable with respect to others of the plurality of elements such that the illumination area is variable.

5. A lithographic system for projecting an image onto a workpiece using radiation, the lithographic system comprising:
 a support structure for supporting a workpiece;
 a radiation source for providing radiation to project an image on the workpiece;
 a reticle positioned between the radiation source and the workpiece; and
 a mask being positioned within 100 mm of the reticle along a z-axis of the lithographic system, the mask being configured to block radiation from the radiation source, wherein the mask includes a body portion and a radiation absorbing coating applied to at least a portion of an external surface of the body portion, wherein the radiation absorbing coating is an inorganic black coating, the mask defining an illumination area of the image to be projected onto the workpiece using a pattern of the reticle and radiation from the radiation source, the mask including a plurality of elements configured to define the illumination area, wherein at least one of the plurality of elements is positioned above the reticle along the z-axis of the lithographic system, and at least one other of the plurality of elements is positioned below the reticle along the z-axis of the lithographic system.

6. The lithographic system of claim 5 wherein (i) the plurality of elements positioned above the reticle along the z-axis includes a pair of elements configured to move with respect to one another along an x-axis of the lithographic system and (ii) the plurality of elements positioned below the reticle along the z-axis includes a pair of elements configured to move with respect to one another along a y-axis of the lithographic system.

7. The lithographic system of claim 1, wherein the mask includes a heat removal apparatus, the heat removal apparatus directing a cooling fluid toward the reticle, wherein the heat removal apparatus defines at least one cooling channel configured to receive the cooling fluid from a fluid source.

8. The lithographic system of claim 7 wherein the cooling fluid is air, and the fluid source is an air supply.

9. The lithographic system of claim 7 wherein the cooling fluid is a liquid, and the fluid source is a cooling liquid supply.

10. The lithographic system of claim 1, wherein the mask includes a heat removal apparatus, the heat removal apparatus directing a cooling fluid toward the reticle, wherein the heat removal apparatus defines a plurality of cooling channels configured to receive the cooling fluid from a fluid source.

11. The lithographic system of claim 10 wherein the heat removal apparatus includes at least one return channel directing the cooling fluid back to the fluid source.

12. The lithographic system of claim 10 wherein the cooling fluid is directed toward the reticle by the heat removal apparatus after providing cooling to at least a portion of the mask.

13. The lithographic system of claim 1, wherein the mask includes a heat removal apparatus, the heat removal apparatus directing a cooling fluid toward the reticle, wherein the mask includes a plurality of elements collectively defining an illumination area of an image to be projected onto the workpiece using a pattern of the reticle and radiation from the radiation source, at least one of the plurality of elements including at least a portion of the heat removal apparatus.

14. The lithographic system of claim 13 wherein at least one of the plurality of elements is positioned above the reticle along a z-axis of the lithographic system, and at least one other of the plurality of elements is positioned below the reticle along the z-axis of the lithographic system.

15. The lithographic system of claim 13 wherein at least one of the plurality of elements is moveable with respect to another of the plurality of elements such that a size of the illumination area may be adjusted.

16. The lithographic system of claim 13 wherein the plurality of elements includes a plurality of blades.

17. The lithographic system of claim 1, wherein the mask includes a heat removal apparatus, the heat removal apparatus directing a cooling fluid toward the reticle, wherein the mask defines an illumination area of an image to be projected onto the workpiece using a pattern of the reticle and radiation from the radiation source, wherein the mask is moveable within an x-y plane of the lithographic system such that a location of the illumination area may be varied.

18. The lithographic system of claim 1 wherein the mask defines a plurality of illumination areas, each of the plurality of illumination areas being configured to define an image to be projected onto the workpiece using a pattern of the reticle and radiation from the radiation source.

19. The lithographic system of claim 18 wherein the mask is moveable within an x-y plane of the lithographic system to select from among the plurality of illumination areas.

* * * * *